United States Patent [19]
Arnborg

[11] Patent Number: 5,939,759
[45] Date of Patent: Aug. 17, 1999

[54] SILICON-ON-INSULATOR DEVICE WITH FLOATING COLLECTOR

[75] Inventor: Torkel Bengt Arnborg, Stockholm, Sweden

[73] Assignee: Telefonaktiebolaget LM Ericsson, Stockholm, Sweden

[21] Appl. No.: 08/836,426

[22] PCT Filed: Oct. 31, 1995

[86] PCT No.: PCT/SE95/01284

§ 371 Date: Jun. 21, 1997

§ 102(e) Date: Jun. 21, 1997

[87] PCT Pub. No.: WO96/13862

PCT Pub. Date: May 9, 1996

[30] Foreign Application Priority Data

Oct. 31, 1994 [SE] Sweden .................................. 9403722

[51] Int. Cl.$^6$ .................................................. H01L 29/04
[52] U.S. Cl. .................... 257/378; 257/347; 257/575; 257/576; 257/556; 257/555; 257/560; 257/561; 257/562; 257/564
[58] Field of Search .................................... 257/347, 370, 257/371, 378, 499, 557, 560, 575, 576, 565, 519, 500, 591–592, 505, 556, 555, 561–564

[56] References Cited

U.S. PATENT DOCUMENTS

| | | | |
|---|---|---|---|
| 3,995,307 | 11/1976 | Alcorn et al. ............................ | 257/500 |
| 4,819,055 | 4/1989 | Nakazato et al. . | |
| 4,835,596 | 5/1989 | Werner .................................... | 257/500 |
| 4,861,731 | 8/1989 | Bhagat . | |
| 5,327,006 | 7/1994 | Beasom .................................. | 257/519 |
| 5,341,022 | 8/1994 | Kuroi et al. . | |
| 5,419,786 | 5/1995 | Kokawa et al. ........................ | 148/33.5 |
| 5,621,239 | 4/1997 | Horie et al. ............................. | 257/347 |
| 5,659,190 | 8/1997 | Litwin . | |

FOREIGN PATENT DOCUMENTS

| | | | |
|---|---|---|---|
| 000581625 A1 | 2/1994 | European Pat. Off. ............... | 257/378 |
| 403082041 | 4/1991 | Japan .................................... | 257/378 |

OTHER PUBLICATIONS

A. Litwin et al., "Extremely Compact CMOS Compatible Bipolar Silicon–On–Insulator Transistor for Mixed High Voltage and High Density Integrated Circuit Applications" Late News Sessions, ESSDERC'93 (Sep. 1993).

A. Litwin et al., "Compact Very High Voltage CMOS Compatible Bipolar Silicon–On–Insulator Transistor" Proc. of the 6th Int'l Symposium on Power Semiconductor Devices & IC's, pp. 113–115 (May–Jun. 1994).

*Primary Examiner*—Fetsum Abraham
*Attorney, Agent, or Firm*—Burns, Doane, Swecker & Mathis, L.L.P.

[57] ABSTRACT

In a semiconductor device including a silicon substrate, an insulating layer on the silicon substrate, a silicon layer on the insulating layer, the silicon layer being weakly doped with impurities of a first conduction type, a base region extending into the silicon layer from the free surface thereof, the base region being doped with impurities of a second conduction type, an emitter region extending into the base region from the free surface thereof, the emitter region being heavily doped with impurities of the first conduction type, and at least one collector region extending into the silicon layer from the free surface thereof at a lateral distance from the base region, the collector region being doped with impurities of the first conduction type, a floating collector region is provided in the silicon layer between the insulating layer and the base region at a distance from the base region. The lateral extension of the floating collector region is larger than that of the emitter region and smaller than that of the base region and the floating collector region is more doped with impurities of the first conduction type than the silicon layer.

3 Claims, 1 Drawing Sheet

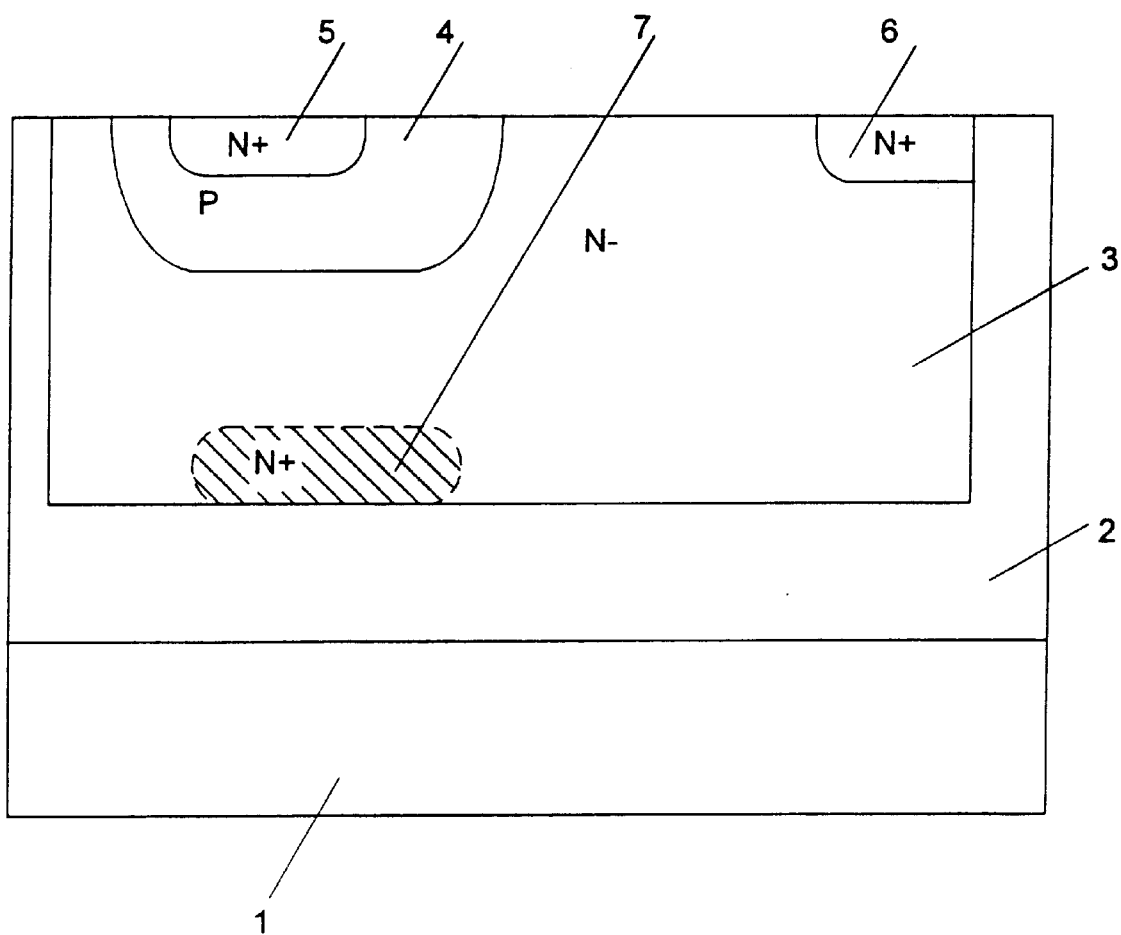

SILICON-ON-INSULATOR DEVICE WITH FLOATING COLLECTOR

BACKGROUND

The invention relates to a semiconductor device comprising a silicon substrate, an insulating layer on said silicon substrate, a silicon layer on said insulating layer, said silicon layer being weakly doped with impurities of a first conduction type, a base region extending into said silicon layer from the free surface thereof, said base region being doped with impurities of a second conduction type, an emitter region, extending into said base region from the free surface thereof, said emitter region being heavily doped with impurities of said first conduction type, and at least one collector region extending into said silicon layer from the free surface thereof at a lateral distance from said base region, said collector region being doped with impurities of said first conduction type.

A bipolar silicon-on-insulator transistor having the above structure, is known from Andrej Litwin and Torkel Arnborg: "Extremely compact CMOS compatible bipolar silicon-on-insulator transistor for mixed high voltage and high density integrated circuit applications", Late News Paper at ESSDERC'93, September, 1993, and Andrej Litwin and Torkel Arnborg: "Compact Very High Voltage Compatible Bipolar Silicon-On-Insulator Transistor", ISPSD'93, Davos, June, 1994.

The emitter-base structure of such a transistor, is vertical but the high collector voltage is supported by a lateral fully depleted collector region. The transistor can be designed to handle almost any desired voltage up to several hundred volts.

One important feature of a high speed transistor is the unity gain frequency. This frequency is the inverse sum of the relevant transit times in the transistor. In the known silicon-on-insulator transistor the most important transit times are those required for vertical transport across the base and for lateral transport along the silicon-oxide interface. The physical transport mechanism is in most cases diffusion and not drift implying that the transit times are proportional to the inverse square of the transport distance. Since the lateral distance at the interface is larger than the vertical distance in the base the associated transit time is much larger. The speed of the transistor is thus mainly limited by the transit time at the interface.

SUMMARY

The object of the invention is to eliminate the limitations on speed imposed by the lateral diffusion along the silicon-oxide interface and bring about a high speed transistor without affecting its high voltage capability.

This is accomplished by the invention in a semiconductor device of the above type by a floating collector region being provided in said silicon layer between said insulating layer and said base region at a distance from said base region, the lateral extension of said floating collector region being larger than that of the emitter region and smaller than that of the base region, said floating collector region being more doped with impurities of said first conduction type than said silicon layer.

BRIEF DESCRIPTION OF DRAWING

The invention will be described more in detail with reference to the appended drawing on which the single FIGURE shows an embodiment of a bipolar silicon-on-insulator transistor according to the invention.

DETAILED DESCRIPTION

The single FIGURE on the drawing shows an embodiment of a bipolar silicon-on-insulator (SOI) transistor according to the invention. The transistor comprises a silicon substrate 1 on which an insulating oxide layer 2 is provided.

A silicon layer 3 which is weakly doped with impurities of conduction type N, is provided on the insulating oxide layer 2.

A base region 4 which is doped with impurities of conduction type P, extends into the silicon layer 3 from the free surface thereof.

An emitter region 5 which is heavily doped with impurities of conduction type N, extends into the base region 4 from the free surface thereof.

In the embodiment shown, the transistor comprises one collector contact region 6 which is doped with impurities of conduction type N. The collector region extends into the silicon layer 3 from the free surface thereof at a lateral distance from the base region 4.

In another embodiment (not shown), the transistor may comprise two contact regions located on either side of the base region.

As mentioned above, the transport of carriers along the interface between the silicon layer 3 and the oxide layer 2 below the base 4 and the emitter 5, is mainly diffusion, and the associated transit time is limiting the speed of the transistor substantially.

However, according to the invention, by inserting a floating collector region 7 selectively below the base 4 and the emitter 5 the high speed limited by the base-emitter structure, is achievable without affecting the high voltage capability.

In accordance with the invention, the floating collector region 7 is provided in the silicon layer 3 between the insulating oxide layer 2 and the base region 4 at a distance from the base region 4. The lateral extension of the floating collector region 7 is larger than the lateral extension of the emitter region 5 and smaller than the lateral extension of the base region 4. Also according to the invention, the floating collector region 7 is more doped with impurities of conduction type N than the silicon layer 3.

By adding the highly doped N-type floating collector region 7 below the base 4 and the emitter 5, the limiting transit time was reduced to almost zero without affecting the high voltage capability. Thus, a unique combination of very high speed and very high voltage devices can be realized in a single process with only layout variations.

I claim:

1. A semiconductor device, comprising:

a silicon substrate;

an insulating layer on the silicon substrate;

a silicon layer on the insulating layer, the silicon layer being weakly doped with impurities of a first conduction type;

a base region extending into the silicon layer from a free surface thereof, the base region being doped with impurities of a second conduction type;

an emitter region extending into the base region from the free surface thereof, the emitter region being heavily doped with impurities of the first conduction type;

at least one collector contact region extending into the silicon layer from the free surface thereof at a lateral distance from the base region, the collector contact region being doped with impurities of the first conduction type; and a floating collector region provided in the silicon layer between the insulating layer and the base region at a distance from the base region, the floating collector region being more doped with impurities of the first conduction type than the silicon layer, a lateral extension of the floating collector region being larger than that of the emitter region and smaller than that of the base region.

2. The semiconductor device of claim 1, wherein the floating collector region is located below the base region and the emitter region.

3. The semiconductor device of claim 1, further comprising a second collector contact region located on the other side of the base region than the at least one collector contact region.

* * * * *